(12) United States Patent
Park et al.

(10) Patent No.: US 11,363,432 B2
(45) Date of Patent: Jun. 14, 2022

(54) METHOD AND DEVICE FOR DATA TRANSMISSION IN V2I NETWORK

(71) Applicant: Ewha University-Industry Collaboration Foundation, Seoul (KR)

(72) Inventors: Hyunggon Park, Gyeonggi-do (KR); Jungmin Kwon, Gyeonggi-do (KR)

(73) Assignee: Ewha University—Industry Collaboration Foundation, Seoul (KR)

( * ) Notice: Subject to any disclaimer, the term of this patent is extended or adjusted under 35 U.S.C. 154(b) by 29 days.

(21) Appl. No.: 17/002,301

(22) Filed: Aug. 25, 2020

(65) Prior Publication Data

US 2021/0160668 A1 May 27, 2021

Related U.S. Application Data

(60) Provisional application No. 62/939,750, filed on Nov. 25, 2019, provisional application No. 62/939,752, filed on Nov. 25, 2019.

(30) Foreign Application Priority Data

Nov. 26, 2019 (KR) .......................... 10-2019-0153406
Nov. 26, 2019 (KR) .......................... 10-2019-0153440

(51) Int. Cl.
*H04W 4/44* (2018.01)
*H04W 36/08* (2009.01)
*H04W 72/04* (2009.01)

(52) U.S. Cl.
CPC ............. *H04W 4/44* (2018.02); *H04W 36/08* (2013.01); *H04W 72/0446* (2013.01); *H04W 72/0466* (2013.01)

(58) Field of Classification Search
CPC ... H04W 4/44; H04W 36/08; H04W 72/0446; H04W 72/0466; H04L 1/0009; H04L 1/0041; H04L 1/0076
See application file for complete search history.

(56) References Cited

U.S. PATENT DOCUMENTS 9,402,209 B1 * 7/2016 Vivanco .............. H04W 36/026
9,985,654 B1 * 5/2018 Ruan .................... H03M 13/154
(Continued)

FOREIGN PATENT DOCUMENTS

KR   20120012849 A   2/2012
KR   20120071289 A   7/2012
(Continued)

OTHER PUBLICATIONS

Heiden et all.,Network Coding for Mobile Devices—Systematic Binary Random Rateless Codes, 2009 IEEE International Conference on Communications Workshops, Jun. 14-18, 2009, Dresden, Germany (Year: 2009).*

(Continued)

*Primary Examiner* — Jeffrey M Rutkowski
*Assistant Examiner* — Chae S Lee
(74) *Attorney, Agent, or Firm* — KDB Firm PLLC

(57) ABSTRACT

A reliable data transmission method and system based on a predicted amount of data in a vehicle-to-infrastructure (V2I) network is disclosed. A data transmission method of a base station includes determining a maximum amount of data to be transmitted from the base station disposed around a road to a vehicle traveling on the road, determining an encoding number for systematic network coding (SNC) based on the determined amount of data, performing the SNC on original data based on the encoding number and the amount of data, and transmitting encoded data obtained by performing the SNC to the vehicle.

6 Claims, 7 Drawing Sheets

(56) References Cited

U.S. PATENT DOCUMENTS

| | | |
|---|---|---|
| 2015/0049677 A1 | 2/2015 | Lin et al. |
| 2016/0134546 A1* | 5/2016 | Anderson ............... H04L 47/25 370/235 |
| 2021/0091892 A1* | 3/2021 | Jiang ..................... H04L 1/1812 |

FOREIGN PATENT DOCUMENTS

| | | |
|---|---|---|
| KR | 20190064819 A | 6/2019 |
| KR | 20190067242 A | 6/2019 |

OTHER PUBLICATIONS

J. Kwon and H. Park, "Efficient and Reliable Data Dissemination over Handover Dynamics in V2I Networks," 2020 IEEE International Conference on Consumer Electronics (ICCE), Las Vegas, NV, USA, 2020, pp. 1-2, doi:10.1109/ICCE46568.2020.9042975.

Kim et al., "A Study on High Fidelity V2I Data Delivery based on Systematic Network Coding" Systematic Network Coding—2017, 3 pages.

Liu et al., "Data Dissemination With Network Coding in Two-Way Vehicle-to-Vehicle Networks" IEEE Transactions on Vehicular Technology, vol. 65, No. 4, pp. 2445-2456, Apr. 2016.

Kwon et al., "Systematic Network Coding based High Fidelity RLNC Encoding Number in V2I Networks" JCCI 2018, 3 pages.

J. Kwon and H. Park, "Reliable Data Dissemination Strategy based on Systematic Network Coding in V2I Networks," 2019 International Conference on Information and Communication Technology Convergence (ICTC), Jeju Island, Korea (South), 2019, pp. 744-746, doi: 10.1109/ICTC46691.2019.8939745.

* cited by examiner

METHOD AND DEVICE FOR DATA TRANSMISSION IN V2I NETWORK

CROSS-REFERENCE TO RELATED APPLICATIONS

This application claims the benefit under 35 U.S.C. § 119(e) of U.S. Provisional Application No. 62/939,750 filed on Nov. 25, 2019, U.S. Provisional Application No. 62/939,752 filed on Nov. 25, 2019 in the U.S. Patent and Trademark Office, KR Application No. 10-2019-0153406 filed on Nov. 26, 2019 and KR Application No. 10-2019-0153440 filed on Nov. 26, 2019 in the Korean Intellectual Property Office, the entire disclosure of which is incorporated herein by reference for all purposes.

BACKGROUND

1. Field

The following description relates to a reliable data transmission method and system based on a predicted amount of data in a vehicle-to-infrastructure (V2I) network, and more particularly, to a method and system for transmitting data through systematic network coding (SNC) using a maximum amount of data to be transmitted to a vehicle traveling on a road.

2. Description of Related Art

There is a growing demand for a real-time multimedia streaming service in vehicle communications as a vehicle-to-infrastructure (V2I) application provides various infortainment services such as, for example, a mobile Internet protocol television (IPTV) service and a voice over Internet protocol (VoIP) service.

It may be challenging to stably transmit a delay-sensitive multimedia data packet to a moving vehicle because a data loss occurs frequently. There is a handover at which boundaries of coverages of road-side units (RSUs) installed on a side of a road for communication with vehicles over a V2I network encounter each other.

In the V2I network, data to be transmitted to a vehicle may be transmitted by being divided by a plurality of data time slots. Before a handover point, there may be a time slot that is less than a data time slot. In this time slot, a vehicle may not receive data from an RSU to which the vehicle currently belongs, but receive data again from a nearby RSU to which the vehicle is to belong.

A time at which data is not transmitted is referred to as an idle time. At the idle time, a delay in data transmission may occur and the delay is referred to as a handover delay. Thus, there is a desire for solving such an issue.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect provides a reliable data transmission method and system based on a predicted amount of data in a vehicle-to-infrastructure (V2I) network. The method and system may predict a maximum amount of data to be transmitted to a vehicle traveling on a road and increase a decoding performance of the vehicle through systematic network coding (SNC).

The method and system may effectively transmit data to vehicles by performing SNC based on a vehicle speed and a data loss rate.

The method and system may transmit encoded data using SNC to a vehicle, and thus reduce a decoding error rate in a V2I application of the vehicle when the vehicle is at a handover occurring between road-side units (RSUs).

According to an example embodiment, there is provided a data transmission method of a base station including determining a maximum amount of data to be transmitted from the base station disposed around a road to a vehicle traveling on the road, determining an encoding number for SNC based on the determined amount of data, performing the SNC on original data based on the encoding number and the amount of data, and transmitting encoded data obtained by performing the SNC to the vehicle.

The determining of the amount of data may include determining the amount of data based on at least one parameter of information associated with the vehicle, information associated with the road on which the vehicle travels, information associated with the base station, or information associated with a channel formed between the vehicle and the base station.

The determining of the encoding number may include determining the encoding number based on the amount of data and a loss of the data to be transmitted from the base station to the vehicle.

The performing of the SNC may include obtaining the encoded data including an original packet and a coding packet by applying, to the original data of the encoding number, an identity matrix determined based on the encoding number and a coding coefficient matrix determined based on the amount of data and the loss of the data to be transmitted to the vehicle.

According to another example embodiment, there is provided a data transmission method of a reference base station including setting an entire time interval for transmitting encoded data to a vehicle passing a coverage range of the reference base station disposed around a road, extracting a plurality of data time intervals corresponding to the encoded data to be transmitted from the reference base station to the vehicle, determining encoded data to be transmitted to the vehicle in each of the data time intervals, transmitting the encoded data generated by the reference base station in each of the data time intervals, and transmitting a portion of an original packet included in encoded data generated by a nearby base station that is handed over from the reference base station, in a remaining time interval of the entire time interval from which the data time intervals are excluded. Here, the encoded data may include an original packet and a coding packet obtained by performing SNC on original data;

In a data time interval starting from a handover point among a plurality of data time intervals of the nearby base station that is handed over from the reference base station, a remaining portion of the original packet included in the encoded data generated by the nearby base station and a coding packet for the original packet may be transmitted.

The setting of the entire time interval may include setting the entire time interval based on at least one parameter of information associated with the vehicle, information associated with the road on which the vehicle travels, information associated with the reference base station, or information associated with a channel formed between the vehicle and the reference base station.

The data transmission method may further include additionally generating a coding packet corresponding to the remaining time interval using the original packet included in the encoded data generated by the nearby base station.

The determining of the encoded data may include determining a maximum amount of data to be transmitted from the reference base station disposed around the road to the vehicle traveling on the road, determining an encoding number for the SNC based on the determined amount of data, performing the SNC on the original data using the encoding number and the amount of data, and transmitting the encoded data obtained by performing the SNC to the vehicle.

The determining of the amount of data may include determining the amount of data based on at least one parameter of information associated with the vehicle, information associated with the road on which the vehicle travels, information associated with the base station, or information associated with the channel formed between the vehicle and the reference base station.

The determining of the encoding number may include determining the encoding number based on the amount of data and a loss of the data to be transmitted from the reference base station to the vehicle.

The performing of the SNC may include obtaining the encoded data including the original packet and the coding packet by applying, to the original data of the encoding number, an identity matrix determined based on the encoding number and a coding coefficient matrix determined based on the amount of data and the loss of the data to be transmitted to the vehicle.

According to still another example embodiment, there is provided a data processing method of a vehicle including receiving encoded data from a base station disposed around a road, and obtaining original data by decoding the encoded data through SNC. The encoded data may be s result of encoding the original data through the SNC based on a maximum amount of data to be transmitted to the vehicle traveling on the road and on an encoding number.

The amount of data may be determined based on at least one parameter of information associated with the vehicle, information associated with the road on which the vehicle travels, information associated with the base station, or information associated with a channel formed between the vehicle and the base station.

The encoding number may be determined based on the amount of data and a loss of the data to be transmitted from the base station to the vehicle.

The encoded data may include an original packet and a coding packet. The encoding number may be determined by applying, to the original data of the encoding number, an identity matrix determined based on the encoding number and a coding coefficient matrix determined based on the encoding number and a loss of the data to be transmitted to the vehicle.

Other features and aspects will be apparent from the following detailed description, the drawings, and the claims.

Figure 1:
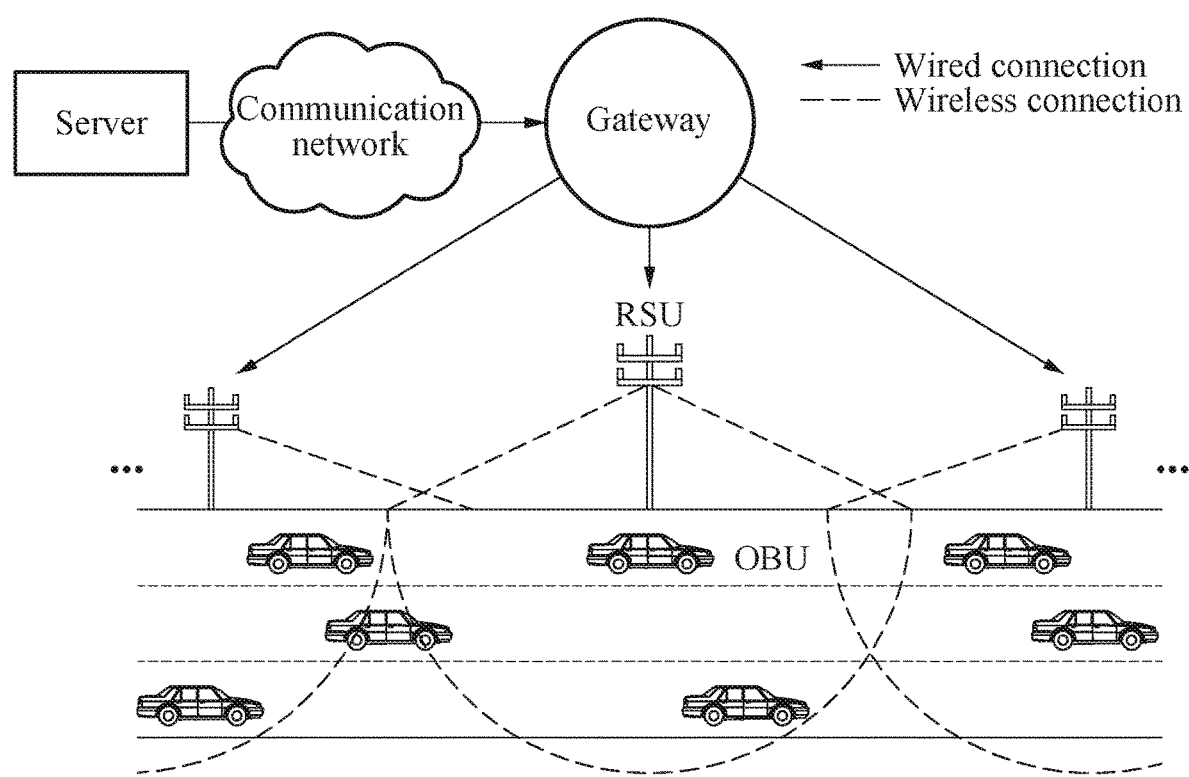
FIG. 1 is a diagram illustrating an example of a vehicle-to-infrastructure (V2I) network environment according to an example embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

Hereinafter, example embodiments will be described in detail with reference to the accompanying drawings. However, various alterations and modifications may be made to the example embodiments. Here, examples are not construed as being limited to the present disclosure and should be understood to include all changes, equivalents, and replacements within the idea and the technical scope of the disclosure.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. Although terms such as "first," "second," and "third" may be used herein to describe various members, components, regions, layers, or sections, these members, components, regions, layers, or sections are not to be limited by these terms. Thus, a first member, component, region, layer, or section referred to in examples described herein may also be referred to as a second member, component, region, layer, or section without departing from the teachings of the examples. As used herein, the term "and/or" includes any one and any combination of any two or more of the associated listed items.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein.

Hereinafter, example embodiments will be described in detail with reference to the accompanying drawings, and like reference numerals in the drawings refer to like elements throughout. Also, in the description of examples, detailed description of well-known related structures or functions will be omitted when it is deemed that such description will cause ambiguous interpretation of the present disclosure.

FIG. 1 is a diagram illustrating an example of a vehicle-to-infrastructure (V2I) network environment according to an example embodiment.

V2I refers to a technology for wireless information exchange between vehicles and road infrastructure. In detail, V2I is a technology that collects travel information from vehicles traveling on a road by installing, around the road, base stations capable of exchanging information with communication terminals installed in the vehicles, and provides the vehicles with traffic condition information and accident information by analyzing the collected travel information by a central server for V2I.

Referring to FIG. 1, a V2I network includes a server, a communication network, a gateway, a road-side unit (RSU), an on-board unit (OBU). The communication network may be a backbone network. An OBU may be a communication terminal installed in a vehicle.

An RSU may be a stationary communication device installed on a side of a road to transmit data to a vehicle on the road. An RSU may thus be a type of base station installed on a side of a road. The server may generate information associated with a current traffic condition, or data to be transmitted to a vehicle upon request by a V2I application installed in the vehicle.

Such traffic data may be transmitted to the gateway through the communication network. The gateway may determine a schedule of traffic data to be transmitted to a vehicle to satisfy a target quality of service (QoS). The traffic data may be transmitted to an RSU through the gateway, and the RSU may encode the received traffic data and transmit the encoded traffic data to an OBU through broadcasting.

The OBU may decode the encoded traffic data received from the RSU. As illustrated in FIG. 1, the server, the gateway, and an RSU may be connected to one another through wired communication, and an RSU and an OBU on the road may be connected to one another through wireless communication. A base station described herein may correspond to an RSU of the V2I network. The base station may include a processor, and the processor may perform a data transmission method described herein.

Figure 2:
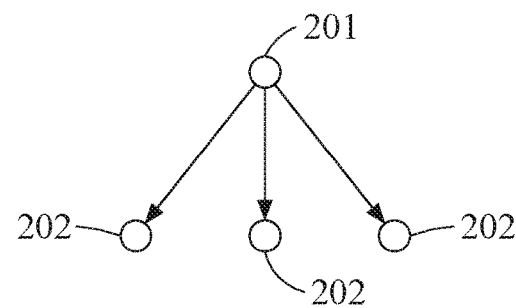
FIG. 2 is a diagram illustrating an example of data transmission using systematic network coding (SNC) according to an example embodiment.

FIG. 2 is a diagram illustrating an example of data transmission using systematic network coding (SNC) according to an example embodiment.

A process of transmitting a delay-sensitive multimedia data packet to a vehicle traveling on a road may not be stably performed due to the frequent occurrence of a data loss.

However, SNC-based communication may reduce a retransmission of lost data and a decoding complexity, and thus improve a decoding performance of an OBU. Thus, SNC may be a communication method that is suitable for a real-time communication environment such as a V2I environment.

In FIG. 2, illustrated is a single-hop network. In the example of FIG. 2, data may be transmitted from a source node 201 to a plurality of clients 202 through broadcasting. In this example, the source node 201 may be a data transmission system or an RSU in a V2I network. In addition, each of the clients 202 may be an OBU included in a vehicle in the V2I network.

In a process of transmitting data from the source node 201 to the clients 202 using SNC, the source node 201 may sequentially transmit original packets that are not encoded as illustrated in FIG. 2.

Subsequently, the source node 201 may additionally transmit a coding packet that is encoded using the network coding. An original packet described herein may refer to a packet unit of original data to be transmitted. In addition, a coding packet described herein may refer to a packet of encoded data obtained by encoding the original data by the source node 201 through encoding using a coding coefficient matrix.

In the example, encoded data 203 may be data obtained by encoding all the transmitted data A, B, and C through the network coding. When a loss of the transmitted data occurs, the clients 202 may restore lost data by decoding the encoded data 203. Thus, the SNC may enable effective data transmission, without requiring a complex operation or computation, because the source node 201 transmits the data itself that is not encoded.

In detail, such data encoding using the SNC may be performed by combining original data to be transmitted to a vehicle by a base station or an RSU which functions as the source node 201, using a matrix in which an identity matrix and a randomly generated coding coefficient matrix are combined.

That is, encoded data, which is a result of encoding original data through the SNC, may include an original packet obtained through a combination of the original data and the identity matrix, and a coding packet obtained through a combination of the original data and the coding coefficient matrix.

Thus, the original packet may be identical to the original data before the encoding. Herein, a method of generating the coding packet through the combination of the original data and the randomly generated coding coefficient matrix may be an encoding method based on random linear networking coding (RLNC). Thus, by decoding the coding packet, the original data may be extracted.

The decoding of the coding packet may be performed by a vehicle in the V2I network. In detail, an OBU included in the vehicle may decode encoded data. The OBU may include a processor, and the processor included in the OBU may perform SNC-based decoding.

The vehicle may extract the original data by combining the received encoded data, and an inverse matrix of the matrix used by the RSU in which the identity matrix and the randomly generated coding coefficient matrix are combined. Thus, even though there is a loss of the original packet included in the received encoded data, the vehicle may obtain data of the lost original packet through the coding packet included in the encoded data.

As a size of a coding packet increases when a base station generates encoded data, a data restoration rate of an original packet may increase when a vehicle decodes the encoded data. However, data to be received by the vehicle from the base station is limited, and thus receiving a greater amount of original data may not be easy when the size of the coding packet increases.

Thus, the base station may determine the size of the coding packet by determining in advance a maximum amount of data to be transmitted to the vehicle using information associated with the vehicle, information associated with a road on which the vehicle travels, information associated with the base station, and information associated which a channel formed between the vehicle and the base station.

Figure 3:
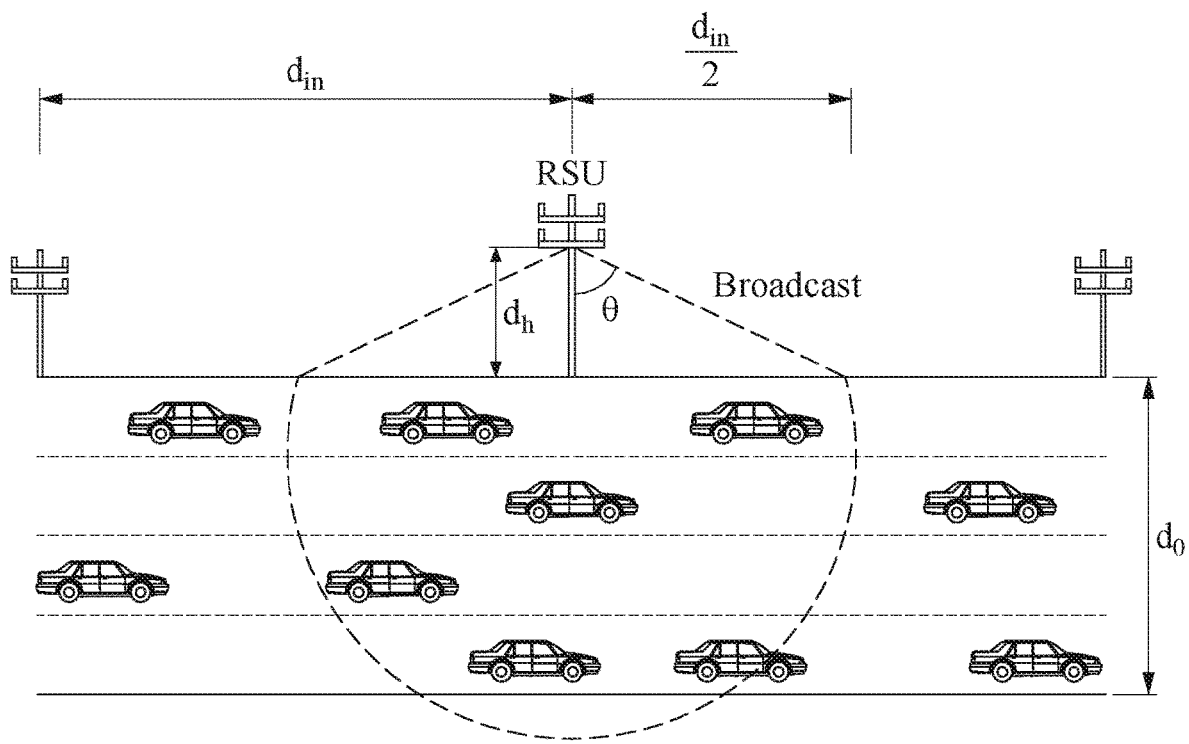
FIG. 3 is a diagram illustrating an example of information used to determine a maximum amount of data that is to be received by a vehicle in a V2I network environment according to an example embodiment.

FIG. 3 is a diagram illustrating an example of information used to determine a maximum amount of data that is to be received by a vehicle in a V2I network environment according to an example embodiment.

In the example of FIG. 3, an RSU may correspond to a base station. As illustrated in FIG. 3, a plurality of OBUs may receive data when they belong to a broadcasting range of the single RSU. When an OBU is out of the broadcasting range of the RSU while the OBU is moving, the OBU may be immediately connected to a nearby RSU installed in succession to the RSU.

All RSUs or base stations present on a highway may be synchronized with one another. That is, when connected RSUs are handed over while a plurality of OBUs are moving in the highway, an OBS may receive, from a current RSU, data that has been received from a previous RSU without interruption or disconnection because the data is all synchronized.

To determine a size of a coding packet for effective data transmission, a base station may determine a maximum amount of data to be transmitted to a vehicle based on information associated with the vehicle, information associated with a road on which the vehicle is traveling, information associated with the base station, and information associated with a channel formed between the vehicle and the base station.

For example, the base station may determine the maximum amount of data to be transmitted to the vehicle using sets of information indicated in Table 1 below. The base station may determine the amount of data by applying the sets of information indicated in Table 1 to Equation 1.

For example, as illustrated in FIG. 3, an RSU or a base station present around a highway including a plurality of one-way lanes may transmit data to different vehicles traveling on the highway. In this example, the RSU has a height $d_h$ and is installed separately from another RSU at an interval of $d_{in}$, and a maximum angle between the RSU and a vehicle is θ.

TABLE 1

| Classification | Description |
| --- | --- |
| BW | Bandwidth of broadcast channel |
| $d_0$ | Width of road |
| $d_{in}$ | Distance between base stations |
| $d_h$ | Height of RSU |
| θ | ½ angle of a range covered by RSU antenna |
| v | Velocity (or speed) of vehicle |
| $P_B$ | Transmission power of RSU |
| $N_0$ | Power spectrum density of white Gaussian noise |
| γ | Path loss exponent |

$$D_T = \rho \cdot \tan\theta \cdot \log[1+\xi\cos\gamma\theta] + \rho \cdot \xi \cdot \gamma \cdot \psi_{\cos\theta}(\gamma,\xi) \quad \text{Equation 1}$$

In Equation 1, θ, ρ, ξ, $\psi_{\cos\theta}(\gamma, \xi)$ may be determined as represented by Equation 2 below.

$$\theta = \tan^{-1}\left(\frac{d_{in}}{2d_h}\right), \quad \text{Equation 2}$$

$$\rho = \frac{BW \cdot d_0}{v},$$

$$\xi = \left(\frac{P_B}{BW \cdot N_0}\right)\left(\frac{d_0}{2}\right)^{-\gamma},$$

$$\psi_{\cos\theta}(\gamma, \xi) = \int_1^{\cos\theta} \frac{t^{\gamma-2}\sqrt{1-t^2}}{1+\xi \cdot t^\gamma} dt.$$

That is, a maximum amount $D_T$ of data to be transmitted to a vehicle may be inversely proportional to a speed of the vehicle, and proportional to a bandwidth of a broadcast channel and a width of a road. Here, a speed of a vehicle may vary continuously on the road, and thus it may need to predict a speed of the vehicle to determine a maximum amount of data to be transmitted to the vehicle.

A base station corresponding to an RSU may include original data to be transmitted to a vehicle. The original data may be information needed for the vehicle, for example, multimedia required by a V2I application of the vehicle, user convenience information, and traffic condition information.

To determine a maximum amount of data to be transmitted to a vehicle for effective data transmission, a base station may analyze a speed of the vehicle through a regression model. An average speed of the vehicle on a highway may change continuously over time, and thus the base station may use various regression analysis models to predict the speed.

For example, the base station may use a linear regression analysis. The linear regression analysis may be simply applied. However, when a data point corresponds to a pattern that is not readily analyzed by a linear model, the analysis may have a limited performance.

For another example, the base station may use a polynomial regression analysis. The polynomial regression analysis may analyze a data pattern of a form that is not analyzed by the linear regression analysis. However, overfitting may occur.

For still another example, the base station may use a gradient boosting regression (GBR) analysis. The GBR analysis may predict a data pattern through an ensemble weak learner that combines individually trained models using a decision tree and performs learning thereby.

In this example, various variables such as the number and depth of decision trees may determine a performance of the GBR analysis. The GBR analysis may enable a rapid change for data that changes rapidly over time, and thus have a favorable performance.

The regression model that is usable is not limited to the foregoing three examples. The base station may determine a predicted speed of the vehicle traveling on the road using the foregoing example models. Thus, the base station may determine a maximum amount of data to be transmitted to the vehicle by inputting, to Equation 1 above, the speed determined using the regression model.

The base station may determine a size of a coding coefficient matrix and an identity matrix to be used for SNC using the maximum amount of data to be transmitted to the vehicle. The size of the identity matrix may be determined based on an encoding number.

The encoding number may correspond to a size of an original packet in encoded data which is a result of performing the SNC on original data, and to the size of the identity matrix used for the SNC. That is, the encoding number may indicate the number of sets of original data on which the SNC is to be performed in the original data to be transmitted from the base station to the vehicle.

For example, the encoding number may be determined based on the maximum amount of data to be transmitted to the vehicle, and a loss of the data to be transmitted to the vehicle. The loss of the data to be transmitted to the vehicle may indicate the number or a ratio of sets of data that are lost when the base station transmits the data to the vehicle. In addition, the loss of the data to be transmitted to the vehicle may indicate a loss amount or a loss rate of encoded data that is predicted when the base station transmits the encoded data to the vehicle.

In addition, the loss of the data to be transmitted to the vehicle may correspond to a channel loss rate. The base station may include information associated with the loss of the data to be transmitted to the vehicle.

In addition, the size of the coding coefficient matrix to be used for the SNC may be determined based on an amount of data to be lost based on the loss of the data to be transmitted to the vehicle. The base station may generate the coding coefficient matrix including a coding coefficient that is randomly generated based on the determined size of the coding coefficient matrix.

The base station may obtain the encoded data including an original packet and a coding packet by applying, to the original data corresponding to the encoding number, the identity matrix determined based on the encoding number and the coding coefficient matrix determined based on the loss of the data to be transmitted to the vehicle.

The base station may transmit the encoded data obtained through the SNC to the vehicle. The vehicle may receive the encoded data from the base station. The vehicle may obtain the original data needed for the vehicle by decoding the received encoded data through the network coding.

In detail, the vehicle may obtain the original data by combining or calculating the encoded data and an inverse matrix of a matrix in which the identity matrix and the coding coefficient matrix that are used to generate the encoded data are combined together.

Figure 4:
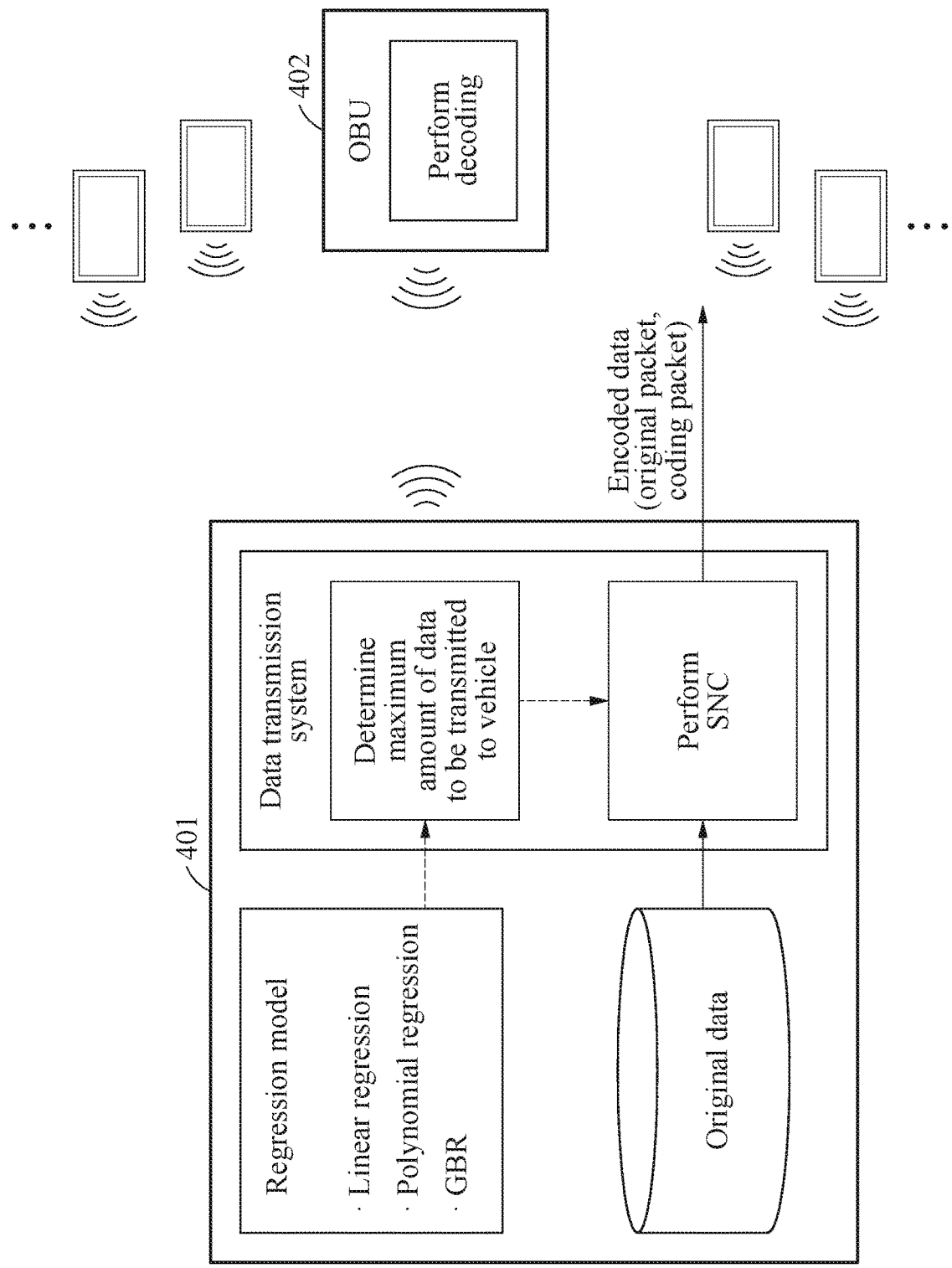
FIG. 4 is a diagram illustrating an example of a base station according to an example embodiment.

FIG. 4 is a diagram illustrating an example of a base station according to an example embodiment.

Referring to FIG. 4, a base station 401 may include original data to be transmitted to a vehicle 402. The original data may correspond to information needed for the vehicle 402, for example, a multimedia requested by a V2I application of the vehicle 402, user convenience information, and traffic condition information.

To determine a maximum amount of data to be transmitted to the vehicle 402 for effective data transmission, the base station 401 may analyze a speed of the vehicle 402 using a regression model. An average speed of the vehicle 402 that is traveling on a highway may continuously change over time, and thus the base station 401 may use various regression analysis models to predict a speed of the vehicle 402.

For example, a linear regression analysis may be used. The linear regression analysis may be simply applied. However, when a data point corresponds to a pattern that is not readily analyzed by a linear model, the analysis may have a limited performance.

For another example, a polynomial regression analysis may be used. The polynomial regression analysis may analyze a data pattern of a form that is not analyzed by the linear regression analysis. However, overfitting may occur.

For still another example, a GBR analysis may be used. The GBR analysis may predict a data pattern through an ensemble weak learner that combines various individually trained models using a decision tree and performs learning thereby.

In this example, various variables such as the number and depth of decision trees may determine a performance of the GBR analysis. The GBR analysis may enable a rapid change for data that changes rapidly rapid over time, and thus have a favorable performance.

The regression model that is usable is not limited to the foregoing three examples. The base station 401 may determine the predicted speed of the vehicle 402 traveling on a road using the regression model. Thus, the base station 401 may determine the maximum amount of data to be transmitted to the vehicle 402 by inputting the speed determined using the regression model to Equation 1 above.

The base station 401 may determine a size of a coding coefficient matrix and an identity matrix to be used for SNC using the maximum amount of data to be transmitted to the vehicle 402. The size of the identity matrix may be determined based on an encoding number.

The encoding number may correspond to a size of an original packet in encoded data which is a result of performing the SNC on original data, and to the size of the identity matrix used for the SNC. That is, the encoding number may indicate the number of sets of original data on which the SNC is to be performed in the original data to be transmitted from the base station 401 to the vehicle 402.

The encoding number may be determined based on the maximum amount of data to be transmitted to the vehicle 402, and a loss of the data to be transmitted to the vehicle 402. The loss of the data to be transmitted to the vehicle 402 may indicate the number or a ratio of sets of data that are lost when the base station 401 transmits the data to the vehicle 402. In addition, the loss of the data to be transmitted to the vehicle 402 may indicate a loss amount or a loss rate of encoded data that is predicted when the base station 401 transmits the encoded data to the vehicle 402.

When the loss rate of data transmitted to the vehicle 402 at the maximum is smaller than a threshold, the base station 401 determines the encoding number according to the loss rate of data without dividing the data transmitted to the vehicle 402. Conversely, when the loss rate of data is greater than or equal to the threshold, the base station 401 divides and encodes data transmitted to the vehicle 402 at the maximum in consideration of handover.

That is, when the loss rate is smaller than the threshold, the size of the encoded data is the same as the size of the data that is transmitted to the vehicle at the maximum, but when the loss rate is greater than or equal to than the threshold, the encoded data is smaller than the size of the data that is transmitted to the vehicle at the maximum.

when the loss rate of data transmitted to the vehicle is smaller than a threshold, an encoding number is determined through Equation 3-5 and encoding data is generated. And, when the loss rate of data transmitted to the vehicle is greater than or equal to the threshold, it will be described later in FIG. 5.

$$K^*(t) = D_T^*(t) \times (1-p) \qquad \text{Equation 3}$$

In Equation 3 above, $K^*(t)$ denotes an encoding number. $D_T^*(t)$ denotes a maximum amount of data to be transmitted to a vehicle based on a predicted speed of the vehicle. p denotes a loss rate of the data to be transmitted to the vehicle. That is, the encoding number may indicate an actual maximum amount of data that is to be actually transmitted to the vehicle in consideration of the loss of the data to be transmitted to the vehicle.

In addition, the size of the coding coefficient matrix to be used for the SNC may be determined based on an amount of data to be lost based on the loss of the data to be transmitted to the vehicle 402. In detail, the size of the coding coefficient matrix may be determined as represented by Equation 4 below.

The base station 401 may generate the coding coefficient matrix including a coding coefficient randomly generated based on the determined size of the coding coefficient matrix. For example, the coding coefficient matrix may be a matrix that has a size of $2^M$ and is randomly selected from a Galois field (GF).

$$N^* = p \times D_T^*(t) \quad \text{Equation 4}$$

In Equation 4, $N^*$ denotes a size of a coding coefficient matrix. That is, the size of the coding coefficient matrix may be determined based on an amount of data to be lost by the loss of the data in a maximum amount of data to be transmitted to a vehicle. Thus, according to an example embodiment, it is possible to transmit data effectively and highly-reliably without transmitting an excessively large amount of data to a vehicle.

The base station 401 may perform the SNC on the original data corresponding to the encoding number using the identity matrix and the coding coefficient matrix that are determined as described above. In detail, the base station 401 may generate encoded data including an original packet and a coding packet by performing a matrix operation as represented by Equation 5 below.

$$\begin{bmatrix} Y_1 \\ \vdots \\ Y_K \\ Y_{K^*+1} \\ \vdots \\ Y_{K^*+N^*} \end{bmatrix} = \begin{bmatrix} I_{K^*} \\ c_{11} & \cdots & c_{1K^*} \\ \vdots & \ddots & \vdots \\ c_{N^*1} & \cdots & c_{N^*K} \end{bmatrix} \otimes \begin{bmatrix} X_1 \\ \vdots \\ X_{K^*} \end{bmatrix} \quad \text{Equation 5}$$

In Equation 5 above, $$\begin{bmatrix} X_1 \\ \vdots \\ X_{K^*} \end{bmatrix}$$

denotes original data corresponding to an encoding number. $\otimes$ denotes a symbol indicating a matrix multiplication of a GF. $I_{K^*}$ denotes an identity matrix corresponding to the encoding number.

In addition, $$\begin{bmatrix} c_{11} & \cdots & c_{1K^*} \\ \vdots & \ddots & \vdots \\ c_{N^*1} & \cdots & c_{N^*K} \end{bmatrix}$$

denotes a coding coefficient matrix.

$$\begin{bmatrix} Y_1 \\ \vdots \\ Y_K \end{bmatrix}$$

denotes an original packet based on a combination of the original data and the identity matrix.

$$\begin{bmatrix} Y_{K'+1} \\ \vdots \\ Y_{K'+N'} \end{bmatrix}$$

denotes a coding packet based on a combination of the original data and the coding coefficient matrix.

The base station 401 may obtain the encoded data including the original packet and the coding packet by applying, to the original data corresponding to the encoding number, the identity matrix determined based on the encoding number and the coding coefficient matrix determined based on the loss of the data to be transmitted to the vehicle 402.

The base station 401 may transmit the encoded data obtained through the SNC to the vehicle 402. The vehicle 402 may receive the encoded data from the base station 401. The vehicle 402 may obtain the original data needed for the vehicle 402 by decoding the received encoded data through the network coding.

In detail, the vehicle 402 may obtain the original data by combining or calculating the encoded data and an inverse matrix of a matrix in which the identity matrix and the coding coefficient matrix used to generate the encoded data are combined together.

Figure 5:
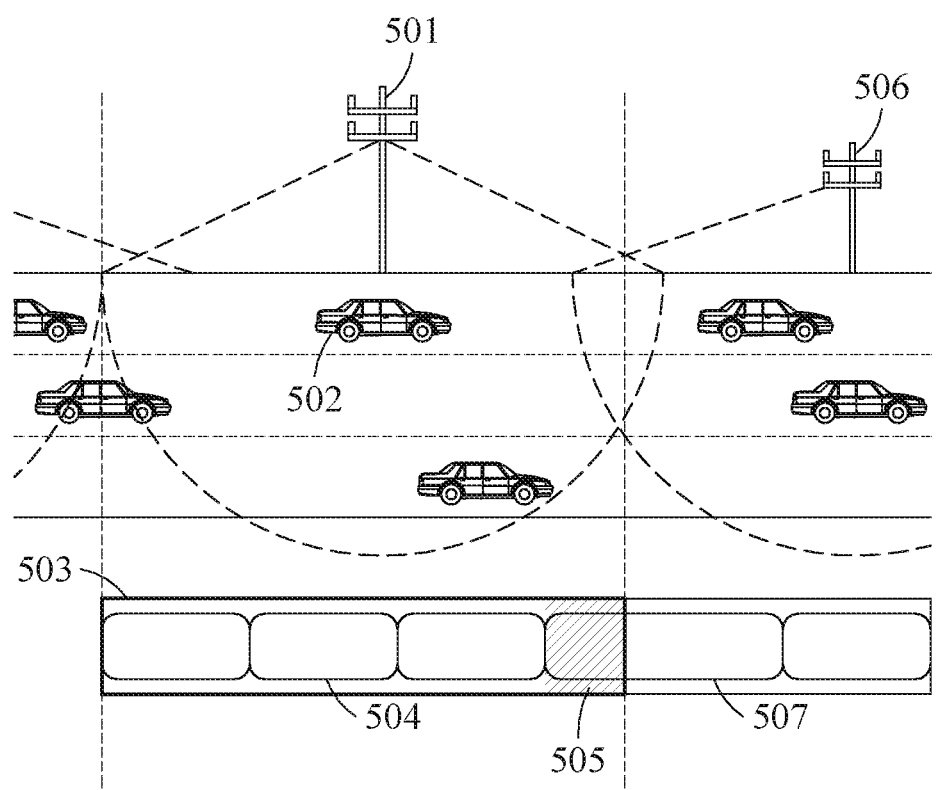
FIG. 5 is a diagram illustrating an example of application of a method of effectively transmitting data at a handover of a V2I network according to an example embodiment.

FIG. 5 is a diagram illustrating an example of application of a method of effectively transmitting data at a handover of a V2I network according to an example embodiment.

FIG. 5 is a diagram illustrating a process of dividing and encoding data transmitted to a vehicle in consideration of handover when a loss rate of data transmitted to the vehicle is greater than a preset threshold.

In FIG. 5, illustrated are a base station or an RSU 501, a vehicle 502 passing a coverage range of the base station 501. The vehicle 502 may include an OBU. In addition, there is an entire time interval 503 based on the coverage range of the base station 501. Herein, a time interval may indicate a time slot that is an amount of time into which an entire time is divided, and be interchangeably used with a time slot.

A handover or a handover point, or a handover interval described herein may refer to a time interval or a time slot in which, when base stations are disposed in succession at a certain interval on a side of a road, a vehicle currently included in a coverage range of a certain base station is to be included in a coverage range of a new base station as the vehicle travels. Since a coverage area that is covered by a base station is limited, a handover may occur at all times in a V2I network.

The entire time interval 503 may refer to an entire amount of time in which the vehicle 502 traveling at a constant speed in the coverage range of the base station 501 receives data. When a vehicle travels at an increased speed, a time in which the vehicle receives data may decrease, and thus an entire time interval may differ for each of vehicles included in the coverage range of the base station 501. In the example of FIG. 5, the base station 501 is also referred to as a reference base station to distinguish it from a nearby base station 506 disposed in adjacent to the base station 501.

The reference base station 501 may continuously transmit a constant amount of data to the vehicle 502 while the vehicle 502 is being in the entire time interval 503. Thus, the entire time interval 503 may be determined based on a maximum amount of data to be transmitted to the vehicle 502. Herein, a maximum amount of data to be transmitted to a vehicle may also indicate a maximum amount of data that the vehicle may receive data.

The base station transmits one encoded data during the entire time period 503 when the loss rate of data transmitted to the vehicle is smaller than a threshold. That is, the base station transmits one original packet and one coding packet in response to the encoding number determined according to the loss rate during the entire time interval.

Conversely, when the loss rate of data is greater than or equal to a threshold, the base station divides the entire time period into a plurality of data time periods 504 in consideration of handover, and transmits encoded data for each data time period 504.

A data time interval 504 may refer to a time interval in the entire time interval 503 that indicates an amount of time in which a vehicle receives a single set of encoded data in case that the loss rate of data transmitted to the vehicle is greater than or equal to a preset threshold. The data time interval 504 corresponds to the size of the encoded data. The encoded data may include an original packet and a coding packet. The encoded data may be transmitted in sequential order, starting from the original packet and then the coding packet.

A vehicle may receive an entire singe set of encoded data in a single data time interval. The data time interval 504 may be one of three data time intervals as illustrated in FIG. 5. The vehicle may receive an entire single set of encoded data in a data time interval.

In the example of FIG. 5, when the vehicle 502 receives a single set of encoded data in each of the data time intervals in the entire time interval 503, there may be a remaining time interval 505. The remaining time interval 505 may be included in the entire time interval 503. However, the remaining time interval 505 is short, and thus a single set of encoded data may not be completely processed in the remaining time interval 505.

Thus, the vehicle 502 may have an idle time at which data is not received in the remaining time interval 505. After the idle time, the vehicle 502 may receive encoded data generated by the nearby base station 506. However, according to an example embodiment, the reference base station 501 may effectively transmit data and additionally transmit a coding packet even at such an idle time, thereby reducing a decoding error rate.

The reference base station 501 may determine a maximum amount of data to be transmitted to the vehicle 502 using at least one parameter of information associated with the vehicle 502 including a speed of the vehicle 502, information associated with the road on which the vehicle 502 travels, information associated with the reference base station 501, or information associated with a channel formed between the vehicle 502 and the reference base station 501.

The reference base station 501 may set the entire time interval 503 based on the maximum amount of data determined with respect to the vehicle 502. In addition, the reference base station 501 may determine encoded data based on the determined amount of data and a loss of the data to be transmitted to the vehicle 502, and extract the data time interval 504 corresponding to a size of the encoded data.

In the example of FIG. 5, there are three data time intervals 504. In this example, the vehicle 502 may receive three sets of encoded data from the reference base station 501 during the entire time interval 503.

While the vehicle 502 is traveling, the reference base station 501 may transmit, to the vehicle 502, a portion of an original packet to be transmitted to the vehicle 502 by the nearby base station 506 in a data time interval 507, in the remaining time interval 505 in the entire time interval 503 from which the data time intervals are excluded.

The nearby base station 506 may be in a handover relationship with the reference base station 501. That is, the nearby base station 506 may be handed over from the reference base station 501. In addition, a remaining time interval may be permanently shorter than a data time interval, and thus an entire single set of encoded data is not transmitted in such a remaining time interval. When an entire time interval is equal to a plurality of data time intervals, a remaining time interval may not exist.

The nearby base station 506 may sequentially transmit remaining encoded data, excluding the portion of the original packet transmitted by the reference base station 501 in the remaining time interval 505, in the data time interval 507. The nearby base station 506 may transmit a coding packet along with such remaining original packet, excluding the portion of the original packet transmitted in the remaining time interval 505.

Here, the encoded data to be transmitted in the data time interval 507 may include an additional coding packet corresponding to the number of original packets transmitted by the reference base station 501. The additional coding packet may be generated by using an original packet included in the encoded data transmitted by the nearby base station 506 in the data time interval 507.

The additional coding packet may contribute to increasing a probability of data being restored in the vehicle 502 despite a data loss occurring in the remaining time interval 505 and the data time interval 507. In addition, a decoding performance of the vehicle 502 may be improved.

According to an example embodiment, base stations installed on a side of a road may be all synchronized with one another, and thus may share original data to be transmitted to a vehicle. For example, when a base station to which a vehicle traveling on a road currently belongs is referred to as a reference base station, the reference base station may transmit encoded data to the vehicle in each data time interval.

When the vehicle approaches a handover point and enters a remaining time interval, the reference base station may transmit, by an amount of the remaining time interval, an original packet of encoded data that is to be transmitted by a nearby base station in a first data time interval. In this example, the nearby base station may indicate a base station to which the vehicle is to belong after passing the handover point.

For example, the reference base station may transmit the original packet of the encoded data generated by the nearby base station by an amount of $N[Dr_i/N]-Dr_i$. In this example, $Dr_i$ denotes a maximum amount of data to be transmitted from the reference base station to the vehicle. In addition, N denotes a size of the encoded data. Thus, $N[Dr_i/N]-Dr_i$ may indicate a remainder obtained by dividing $Dr_i$ by the size of the encoded data.

The vehicle may receive the original packet corresponding to the amount of $N[Dr_i/N]-Dr_i$ in the remaining time interval, and enter the nearby base station. The nearby base station may sequentially transmit a remaining original packet excluding the original packet transmitted in the remaining time interval of the reference base station, and a coding packet, in the first data time interval.

Here, the nearby base station may transmit an additional coding packet corresponding to the amount $(N[Dr_i/N]-Dr_i)$ of the remaining time interval, in the first data time interval of the nearby base station. The additional coding packet may be generated in the reference base station or the nearby base station. This is because the base stations are synchronized with one another.

In detail, a coding coefficient matrix by the amount of $N\lceil Dr_i/N\rceil - Dr_i$ may be additionally generated and combined with original data, and thus the additional coding packet may be generated. According to an example embodiment, a base station may transmit encoded data to a vehicle at a handover according to the following algorithm.

Given $Dr_i$ and RSUs $r_i$, $r_{i+1}$
1: If $N\lceil Dr_i/N\rceil - Dr_i > 0$ then|
  Encode $Y=C\odot X$, where $[C_1, \ldots, C_K]^T$ is identity and $[C_{K+1}, \ldots, C_{N+N\lceil Dr_i/N\rceil - Dr_i}]^T$ is randomly generated.
2: Data transmission for vehicles located at Handover Point
  $r_i$ transmit $Y_1, \ldots, Y_\alpha$ (where $\alpha=N\lceil Dr_i/N\rceil - Dr_i$)
  $r_{i+1}$ transmit $Y_{\alpha+1}, \ldots, Y_{\alpha+N}$ Here, $Dr_i$ denotes a value determined to be a maximum amount of data to be transmitted from a reference base station $r_i$ to a vehicle. In addition, N denotes a size of encoded data. The size of the encoded data may be determined based on an encoding number and a coding coefficient matrix.

K denotes the encoding number. C denotes a matrix in which an identity matrix $[C_1, \ldots, C_K]$ and a coding coefficient matrix $[C_{K+1}, \ldots, C_{N+N\lceil Dr_i/N\rceil - Dr_i}]^T$ are combined. X denotes original data, and Y denotes the encoded data. The size of the encoded data is the result (N=K(1+p)) of combining the encoding number (K) and the value (K*p) reflecting the loss rate (p) of the data in the encoding number.

The coding coefficient matrix may be generated randomly. The coding coefficient matrix may include a coding coefficient that is additionally generated by an amount $(N\lceil Dr_i/N\rceil - Dr_i)$ of a remaining time interval.

$$Y=C\odot X \quad \text{Equation 6}$$

Equation 6 above is an operation equation that performs SNC on original data. In this equation above, $\odot$ denotes a symbol indicating a matrix multiplication operation. Y, which denotes encoded data generated by a reference base station or a nearby base station by encoding the original data X through the SNC, includes an original packet $(Y_1, \ldots, Y_K)$, a coding packet $(Y_{K+1}, \ldots, Y_N)$, and an additional coding packet $Y_{N+1}, \ldots, Y_{N+N\lceil Dr_i/N\rceil - Dr_i}$.

An original packet of Y obtained through an identity matrix may be identical to $X_1, \ldots, X_K$. In addition, a portion $Y_1, \ldots, Y_\alpha$ of the generated encoded data may be transmitted by the reference base station. A base station may transmit an original packet first when transmitting encoded data, and thus $Y_1, \ldots, Y_\alpha$ may be an original packet.

The nearby base station may transmit remaining encoded data $Y_{\alpha+1}, \ldots, Y_{\alpha+N}$ in a first data time interval of the nearby base station. The first data time interval may indicate a data time interval of the nearby base station that is started from a handover point between the nearby base station and the reference base station.

A vehicle receiving the encoded data may derive the original data by calculating the encoded data and an inverse matrix of a matrix in which the identity matrix and the coding coefficient matrix used to generate the encoded data are combined.

Figure 6:
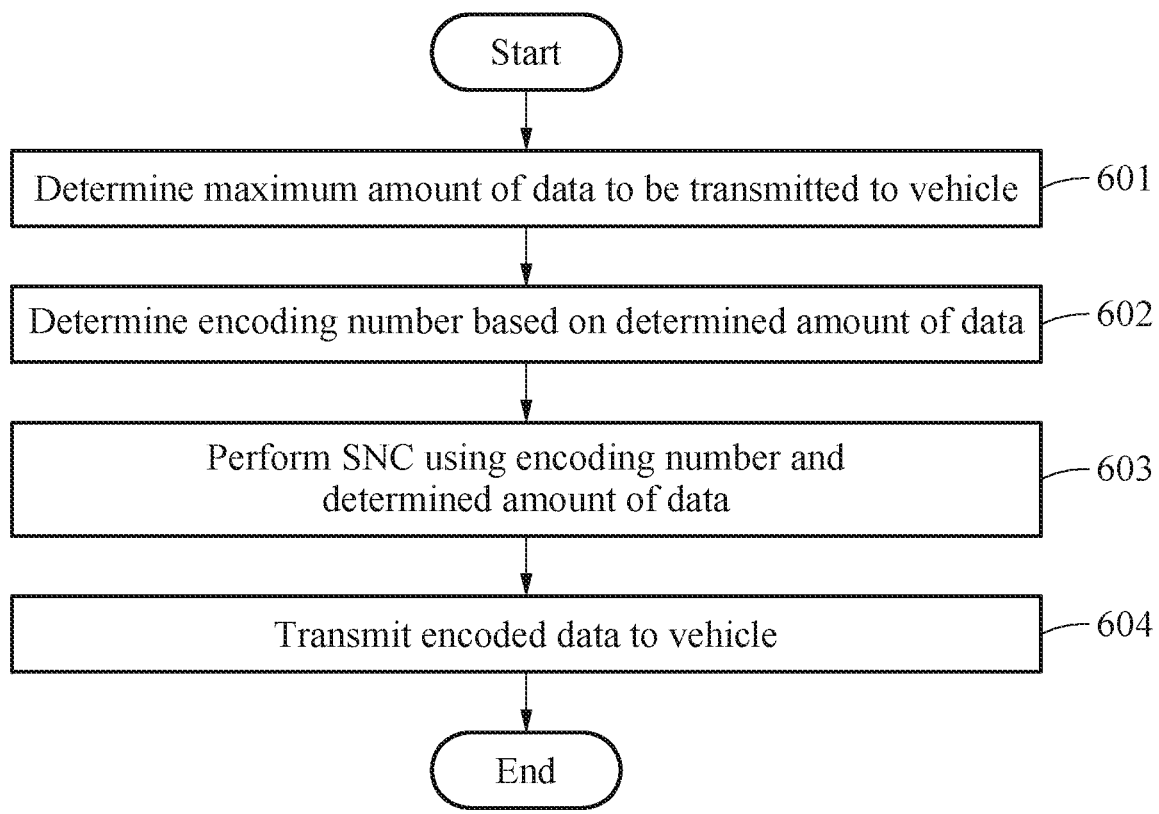
FIG. 6 is a flowchart illustrating an example of a data communication method according to an example embodiment.

FIG. 6 is a flowchart illustrating an example of a data communication method according to an example embodiment.

The data communication method to be described hereinafter with reference to FIG. 6 may be performed by a base station or an RSU.

Referring to FIG. 6, in operation 601, the base station determines a maximum amount of data to be transmitted to a vehicle traveling on a road. The base station may determine the maximum amount of data to be transmitted to the vehicle based on at least one parameter of information associated with the vehicle, information associated with the road on which the vehicle travels, information associated with the base station, or information associated with a channel formed between the vehicle and the base station.

For example, the base station may determine the maximum amount of data to be transmitted to the vehicle using Equation 1 above. In this example, a speed of the vehicle may change continuously over time, and thus it may need to predict a speed of the vehicle to determine the maximum amount of data to be transmitted to the vehicle.

The base station may predict a speed of the vehicle using a regression model. For example, the base station may predict a speed of the vehicle using at least one of linear regression, polynomial regression, or GBR.

In operation 602, the base station determines an encoding number for SNC based on the determined amount of data. The base station may determine the encoding number based on the determined amount of data and a loss of the data to be transmitted to the vehicle.

The encoding number may be used to determine the number of sets of original data on which the SNC is to be performed. The encoding number may correspond to an actual amount of data that is to be actually received by the vehicle from the base station in consideration of the loss of the data.

In operation 603, the base station performs the SNC on the original data using the encoding number and the determined amount of data. The base station may obtain encoded data including an original packet and a coding packet by applying, to the original data of the encoding number, an identity matrix determined based on the encoding number and a coding coefficient matrix.

The coding coefficient matrix may be determined by randomly generating a coding coefficient based on the determined amount of data and the loss of the data to be transmitted to the vehicle. The coding packet generated by an operation of the original data and the coding coefficient matrix may correspond to a redundant RLNC packet.

In operation 604, the base station transmits the encoded data obtained through the SNC to the vehicle. The base station may transmit the encoded data including the original packet and the coding packing to the vehicle. The original packet may be identical to the original data before the SNC.

When a loss of the original packet occurs, the vehicle receiving the encoded data may restore the original packet by decoding the encoded data through the SNC. In detail, the vehicle may obtain the original data from the encoded data using an inverse matrix of a matrix in which the identity matrix and the coding coefficient matrix used to generate the encoded data are combined.

A result of an experiment conducted according to an example embodiment shows that, by predicting a maximum amount of data to be transmitted to a vehicle using a regression model in a V2I environment and transmitting the data based on SNC, a decoding performance is improved while a ratio of performing encoding is maintained.

Figure 7:
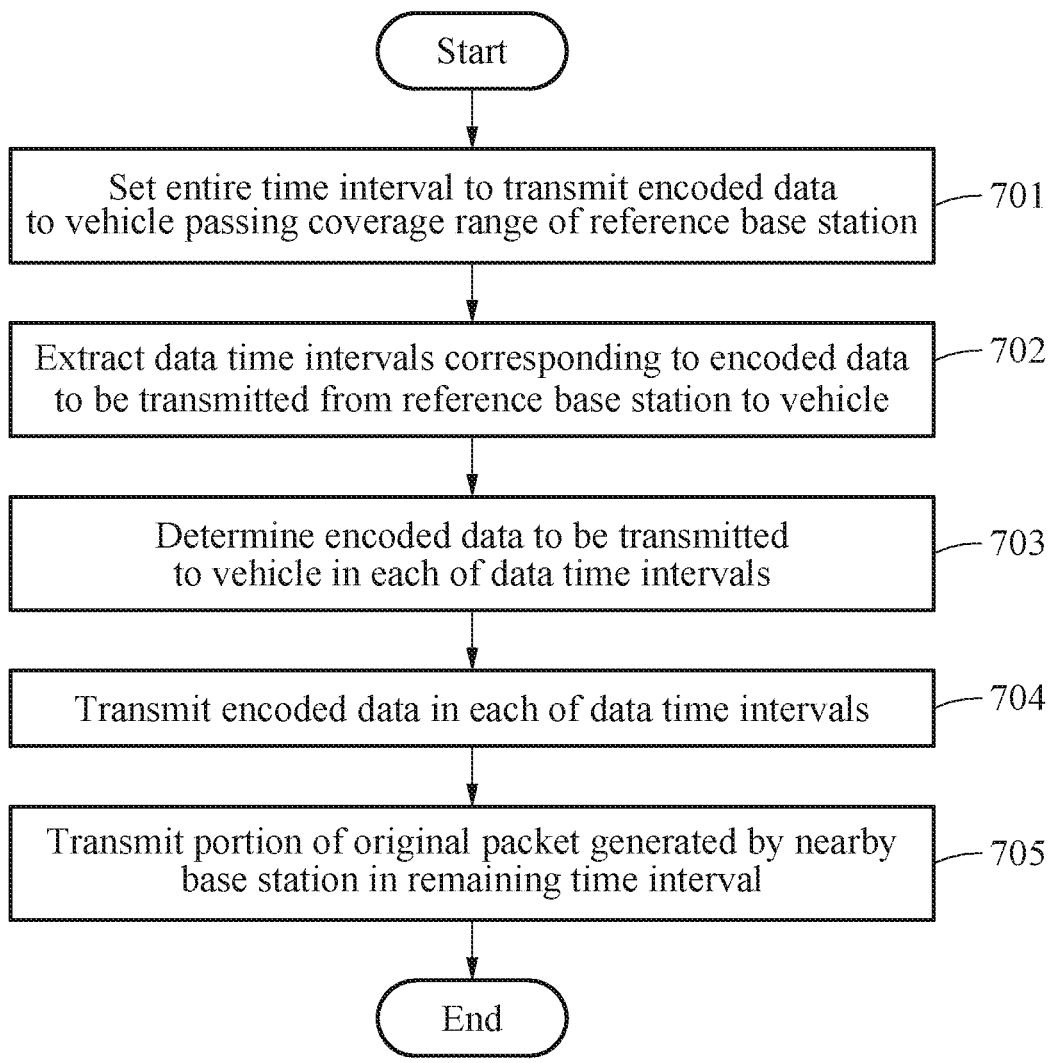
FIG. 7 is a flowchart illustrating an example of a method of effectively transmitting data at a handover of a V2I network according to an example embodiment.

FIG. 7 is a flowchart illustrating an example of a data transmission method of effectively transmitting data at a handover of a V2I network according to an example embodiment.

Referring to FIG. 7, in operation 701, a reference base station disposed around a road sets an entire time interval to transmit encoded data to a vehicle passing a coverage range of the reference base station.

The reference base station may set the entire time interval based on at least one parameter of information associated with the vehicle, information associated with the road on which the vehicle travels, information associated with the reference base station, or information associated with a channel formed between the vehicle and the reference base station.

In operation 702, the reference base station extracts a plurality of data time interval corresponding to the encoded data to be transmitted to the vehicle. Herein, a data time interval may be a time interval used to completely transmitting one set of encoded data from a base station to a vehicle.

Thus, the data time interval may correspond to a size of the encoded data determined by the reference base station using speed information of the vehicle and the like, and thus a size of the data time interval may be fixed. Since the reference base station transmits the encoded data during the entire time interval, the entire time interval may include the plurality of data time intervals.

In operation 703, the reference base station determines a set of the encoded data to be transmitted to the vehicle in each of the data time intervals. The encoded data may include an original packet and a coding packet that are obtained by performing SNC on original data.

In operation 704, the reference base station transmits the encoded data generated by the reference base station in each of the data time intervals.

The reference base station may transmit, to the vehicle, data in each encoded data unit, and thus the reference base station may not transmit an entire single set of the encoded data for a remaining time interval in the entire time interval from which the data time intervals are excluded.

In operation 705, the reference base station transmits a portion of an original packet included in encoded data generated by a nearby base station that is handed over from the reference base station, in the remaining time interval of the entire time interval from which the data time intervals are excluded.

In addition, in a data time interval starting from a handover point among a plurality of data time intervals of the nearby base station, a remaining portion of the original packet from which the transmitted portion of the original packet is excluded, and a coding packet for the original packet may be transmitted in operation 705.

The coding packet may additionally include a coding packet corresponding to the remaining time interval. According to an example embodiment, a base station may effectively transmit data by transmitting data at an idle time of a handover at which a vehicle may not receive data.

In addition, the base station may transmit an additional coding packet corresponding to a remaining time interval, and the vehicle may thus have an increased probability of data restoration despite a data loss occurring in a process of data transmission.

Figure 8:
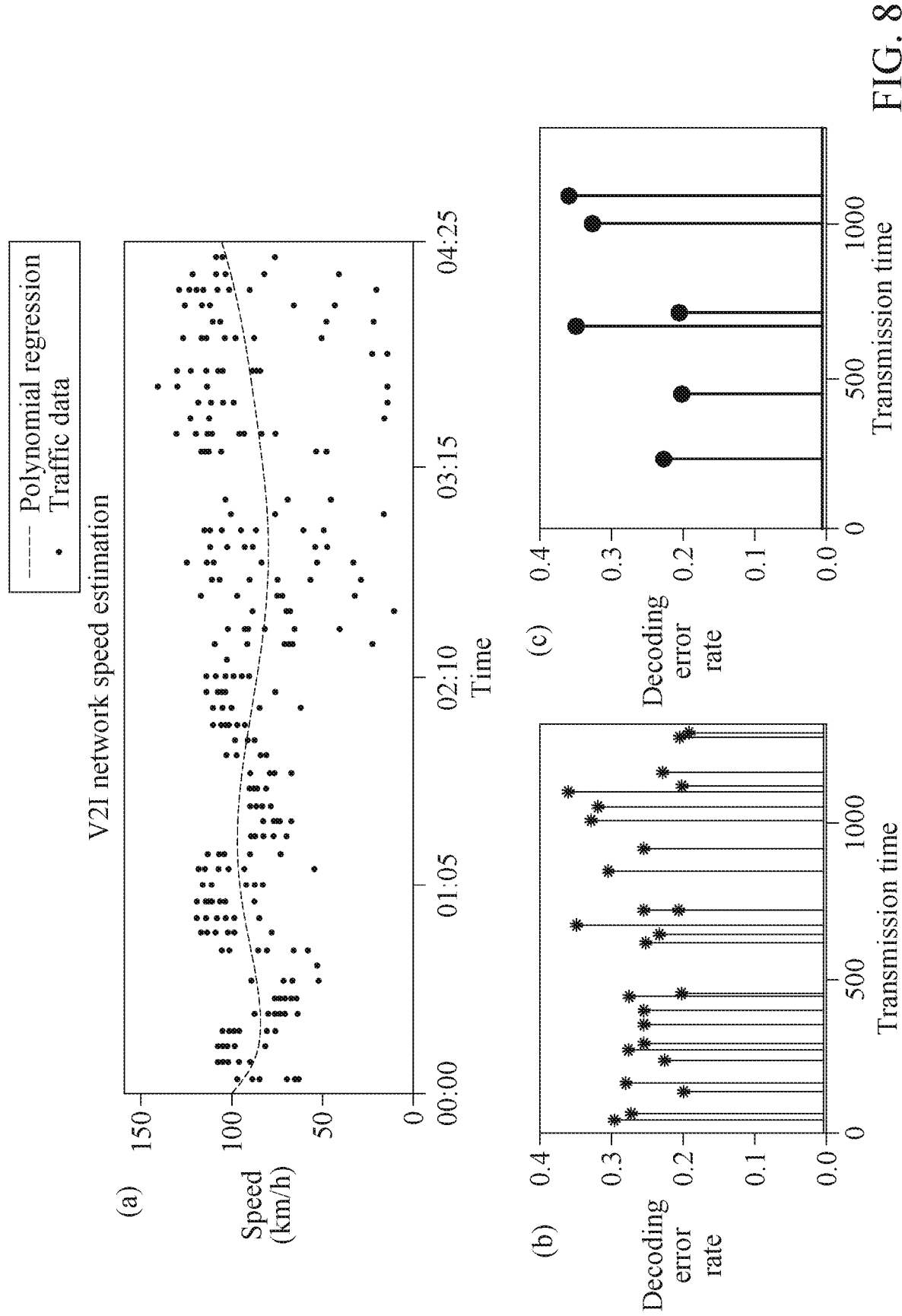
FIG. 8 is a diagram illustrating examples of results obtained by experimenting a method of effectively transmitting data at a handover of a V2I network according to an example embodiment.

FIG. 8 is a diagram illustrating examples of results obtained by experimenting a data transmission method of effectively transmitting data at a handover of a V2I network according to an example embodiment.

FIG. 8 illustrates graphs of results obtained by conducting experiments to verify a performance improvement with respect to a decoding error rate by applying a data transmission method described herein. Traffic data used for the experiments is actual data that is collected from actual traffic on a highway.

For the experiments, a speed of a vehicle present in a coverage range of each RSU was measured using polynomial regression. Based on the measured speed, a total amount $Dr_i$ of data to be received by the vehicle from an i-th RSU ($r_i$) was determined, which is verified in graph (a) of FIG. 8.

Existing SNC resulted in a decoding error rate of 0.52% as shown in graph (b) of FIG. 8, whereas applying a data transmission method described herein to a handover resulted in a decoding error rate of 0.16% as shown in graph (c) of FIG. 8.

According to an example embodiment described herein, there is a provided a reliable data transmission method and system based on a predicted amount of data in a V2I network. The method and system may improve a decoding performance of a vehicle traveling on a road by performing SNC based on a maximum amount of data that is to be received by the vehicle.

The method and system may effectively transmit data to a vehicle by performing SNC based on a speed of the vehicle and a loss rate of the data.

Further, the method and system may transmit, to a vehicle, encoded data obtained using SNC, and thus reduce a decoding error rate in a V2I application of the vehicle when the vehicle is at a handover occurring between RSUs.

The units described herein may be implemented using hardware components and software components. For example, the hardware components may include microphones, amplifiers, band-pass filters, audio to digital convertors, non-transitory computer memory and processing devices. A processing device may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer readable recording medium may include any data storage device that can store data which can be thereafter read by a computer system or processing device.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A data transmission method of a reference base station, comprising:
    setting an entire time interval for transmitting encoded data to a vehicle passing a coverage range of the reference base station disposed around a road;
    extracting a plurality of data time intervals corresponding to the encoded data to be transmitted from the reference base station to the vehicle;
    determining encoded data to be transmitted to the vehicle in each of the data time intervals, wherein the encoded data includes an original packet and a coding packet obtained by performing systematic network coding (SNC) on original data;
    transmitting the encoded data generated by the reference base station in each of the data time intervals; and
    transmitting a portion of an original packet included in encoded data generated by a nearby base station that is handed over from the reference base station, in a remaining time interval of the entire time interval from which the data time intervals are excluded,
        wherein, in a data time interval starting from a handover point among a plurality of data time intervals of the nearby base station that is handed over from the reference base station, a remaining portion of the original packet included in the encoded data generated by the nearby base station and a coding packet for the original packet are transmitted, and
        wherein the determining of the encoded data comprises:
        determining a maximum amount of data to be transmitted from the reference base station disposed around the road to the vehicle traveling on the road;
        determining an encoding number for the SNC based on the determined maximum amount of data;
        performing the SNC on the original data using the encoding number and the maximum amount of data; and
        transmitting, to the vehicle, the encoded data obtained by performing the SNC.

2. The data transmission method of claim 1, wherein the setting of the entire time interval comprises:
    setting the entire time interval based on at least one parameter of information associated with the vehicle, information associated with the road on which the vehicle travels, information associated with the reference base station, or information associated with a channel formed between the vehicle and the reference base station.

3. The data transmission method of claim 1, further comprising:
    additionally generating a coding packet corresponding to the remaining time interval using the original packet included in the encoded data generated by the nearby base station.

4. The data transmission method of claim 1, wherein the determining of the maximum amount of data comprises:
    determining the maximum amount of data based on at least one parameter of information associated with the vehicle, information associated with the road on which the vehicle travels, information associated with the base station, or information associated with a channel formed between the vehicle and the reference base station.

5. The data transmission method of claim 1, wherein the determining of the encoding number comprises:
    determining the encoding number based on the maximum amount of data and a loss of the data to be transmitted from the reference base station to the vehicle.

6. The data transmission method of claim 1, wherein the performing of the SNC comprises:
    obtaining the encoded data including the original packet and the coding packet by applying, to the original data of the encoding number, an identity matrix determined based on the encoding number and a coding coefficient matrix determined based on the maximum amount of data and a loss of the data to be transmitted to the vehicle.

* * * * *